(12) United States Patent
Waechtler et al.

(10) Patent No.: US 8,507,038 B2
(45) Date of Patent: Aug. 13, 2013

(54) SUBSTRATE HAVING A COATING COMPRISING COPPER AND METHOD FOR THE PRODUCTION THEREOF BY MEANS OF ATOMIC LAYER DEPOSITION

(75) Inventors: Thomas Waechtler, Dittmansdorf (DE); Thomas Gessner, Chemnitz (DE); Stefan Schulz, Chemnitz (DE); Heinrich Lang, Chemnitz-Harthau (DE); Alexander Jakob, Muelsen (DE)

(73) Assignees: Fraunhofer-Gesellschaft zur Foerderung der Angewandten Forschung E.V., Munich (DE); Technische Universitaet Chemnitz, Chemnitz (DE)

( * ) Notice: Subject to any disclaimer, the term of this patent is extended or adjusted under 35 U.S.C. 154(b) by 128 days.

(21) Appl. No.: 12/794,454

(22) Filed: Jun. 4, 2010

(65) Prior Publication Data

US 2010/0301478 A1   Dec. 2, 2010

Related U.S. Application Data

(63) Continuation of application No. PCT/DE2008/002037, filed on Dec. 4, 2008.

(30) Foreign Application Priority Data

Dec. 5, 2007   (DE) .......................... 10 2007 058 571

(51) Int. Cl.
*C23C 16/00* (2006.01)
*H01L 21/768* (2006.01)
(52) U.S. Cl.
USPC .......................... 427/250; 427/248.1; 556/110
(58) Field of Classification Search
None
See application file for complete search history.

(56) References Cited

U.S. PATENT DOCUMENTS

| 5,449,799 | A | 9/1995 | Terfloth et al. |
| 5,614,764 | A | 3/1997 | Baerg et al. |
| 6,482,740 | B2 | 11/2002 | Soininen et al. |

(Continued)

FOREIGN PATENT DOCUMENTS

| DE | 42 22 021 A1 | 1/1994 |
| EP | 0 989 133 A2 | 3/2000 |

(Continued)

OTHER PUBLICATIONS

Shen, Wuji Huaxue Xuebao (Chinese Journal of Inorganic Chemistry), vol. 20, No. 11, Nov. 2004.*

(Continued)

*Primary Examiner* — Joseph Miller, Jr.
(74) *Attorney, Agent, or Firm* — Greenblum & Bernstein, P.L.C.

(57) ABSTRACT

A method can be used for the production of a coated substrate. The coating contains copper. A copper precursor and a substrate are provided. The copper precursor is a copper(I) complex which contains no fluorine. A copper-containing layer is deposited by means of atomic layer deposition (ALD) at least on partial regions of the substrate surface by using the precursor. Optionally, a reduction step is performed in which a reducing agent acts on the substrate obtained in the layer deposition step. In various embodiments, the precursor is a complex of the formula $L_2Cu(X \cap X)$ in which L are identical or different σ-donor-π acceptor ligands and/or identical or different σ,π-donor-π acceptor ligands and $X \cap X$ is a bidentate ligand which is selected from the group consisting of β-diketonates, β-ketoiminates, β-diiminates, amidinates, carboxylates and thiocarboxylates.

22 Claims, 7 Drawing Sheets

(56) References Cited

U.S. PATENT DOCUMENTS

| | | | |
|---|---|---|---|
| 6,596,888 B2* | 7/2003 | McElwee-White et al. | 556/59 |
| 6,869,876 B2 | 3/2005 | Norman et al. | |
| 2003/0064153 A1* | 4/2003 | Solanki et al. | 427/255.28 |
| 2004/0175502 A1* | 9/2004 | Senzaki | 427/255.28 |
| 2006/0003517 A1* | 1/2006 | Ahn et al. | 438/216 |
| 2006/0145142 A1* | 7/2006 | Norman | 257/40 |
| 2006/0182884 A1 | 8/2006 | Bradley et al. | |

FOREIGN PATENT DOCUMENTS

| | | |
|---|---|---|
| WO | WO 00/08225 | 2/2000 |
| WO | WO 03/014134 A1 | 2/2003 |
| WO | WO 2004/036624 A2 | 4/2004 |
| WO | WO 2006/015225 A1 | 2/2006 |

OTHER PUBLICATIONS

Soininen, P. J., et al., "Reduction of Copper Oxide Film to Elemental Copper," XP-002523508, Journal of the Electrochemical Society, 2005, pp. G122-G125, vol. 152, No. 2, The Electrochemical Society, Inc.

Zhengwen, L., et al., "Atomic Layer Deposition of Ultrathin Copper Metal Films from a Liquid Copper(I) Amidinate Precursor," XP-002523507, Journal of the Electrochemical Society, 2006, pp. C787-C794, vol. 153, No. 11, The Electrochemical Society, Inc.

Roth, N., et al., "Phosphane Copper(I) Complexes as CVD Precursors," Surface & Coatings Technology, Science Direct, 2007, pp. 9089-9094, vol. 201, No. 22-23, Elsevier.

Waechtler, T., et al., "Composite Films of Copper and Copper Oxide Deposited by ALD Using a Non-Fluorinated Cu(I) Beta-Diketonate Precursor," XP-002523506, AVS 7th International Conference on Atomic Layer Deposition, 2007, 1 page, vol. 7, Chemnitz University of Technology, Chemnitz, Germany.

Waechtler, T., et al., "Copper Oxide Films Grown by Atomic Layer Deposition from Bis(tri-n-butylphosphane)copper(I)acetylacetonate on Ta, TaN, Ru, and $SiO_2$," Journal of the Electrochemical Society, 2009, pp. H453-H459, vol. 156, No. 6, The Electrochemical Society, Inc.

N. Pinna and M. Knez (eds): Atomic Layer Deposition of Nanostructured Materials. Chapter 3: Precursors for ALD Processes. 2012, pp. 41-51.

M. Leskelä et al., Atomic Layer Deposition Chemistry: Recent Developments and Future Challenges. Angew. Chem. Int. Ed., 2003, vol. 42, pp. 5548-5554.

Martensson et al., *J. Electrochem. Soc.*, vol. 145, No. 8, pp. 2926-2931, 1998.

Rosenberg et al., *Annu. Rev. Mater. Sci.* vol. 30, pp. 229-262, 2000.

Choi, Reliability of Copper Interconnects in Integrated Circuits, Dissertation, 2007 (Abstract).

* cited by examiner

SUBSTRATE HAVING A COATING COMPRISING COPPER AND METHOD FOR THE PRODUCTION THEREOF BY MEANS OF ATOMIC LAYER DEPOSITION

This application is a continuation of co-pending International Application No. PCT/DE2008/002037, filed Dec. 4, 2008, which designated the United States and was not published in English, and which claims priority to German Application No. 10 2007 058 571.5 filed Dec. 5, 2007, both of which applications are incorporated herein by reference.

TECHNICAL FIELD

The invention relates to a method for depositing thin copper layers or copper-containing layers by means of atomic layer deposition (ALD). This method is suitable in particular for depositing copper or copper-containing layers on semiconductor substrates (for example, for the production of multilayer conductor track or interconnect systems in highly integrated microelectronic circuits—ULSI circuits).

BACKGROUND

In general, physical methods, especially cathode sputtering, have been used to date for the production of thin copper layers. However, this method has the disadvantage that, particularly in the production of copper starting layers for the interconnect system of highly integrated circuits—with increasing reduction of the geometrical dimensions—uniform closed surface layers are no longer obtained.

Chemical methods, for example, variants of chemical vapor deposition (CVD), are suitable as alternative methods for producing such layers. Here, source substances or precursors which contain the desired metal (e.g., copper) in the form of a chemical compound are fed in the gaseous state to a vacuum chamber which is in the form of a hot- or cold-wall reactor and in which the layer deposition is subsequently effected. For this purpose, the precursors are converted into the gas phase prior to deposition. Accordingly, a layer formation reaction takes place on the surface of the heated wafer substrate. This may consist in targeted thermally controlled decomposition of the precursor; often, reducing or oxidizing agents are also necessary for the layer deposition. However, the CVD methods have the disadvantage that the layer growth is not uniform here and closed surface layers form only from a thickness of a few 10 nm.

By using atomic layer deposition (ALD), these disadvantages can be avoided. This is a cyclic method in which in general two reactants are fed to the reaction chamber in pulses. These pulses are separated from one another by inert purging and/or evacuation steps so that the two reactants never meet one another in the gas phase and exclusively surface reactions of the second reactant with adsorbates of the first reactant lead to layer formation. The first reactant is initially chemisorbed on the substrate surface so that the substrate is substantially covered with a monolayer of the precursor. Further monolayers which form by physisorption are removed during the purging or evacuation pulses. It is therefore necessary for the precursor to be able to undergo chemisorption on the substrate to be coated. By means of the ALD method, it is therefore possible to control the desired layer thickness very accurately via the number of ALD cycles.

In order to produce copper layers by means of ALD, in general two approaches can be chosen for the deposition. Either elemental copper can be produced directly during the individual ALD cycles; alternatively first a copper species can be produced (e.g., copper oxide—$CuO_x$), which is then reduced to copper. The first variant for the production of elemental copper is, however, generally difficult.

U.S. Pat. No. 6,869,876 B2 describes a method of the generic type in which first a copper halide layer is produced on the substrate and is then reduced by means of a reducing agent to give a copper layer. Copper(I) and copper(II) complexes are used here as a precursor. In particular, complexes of the type LCu(X∩X) are mentioned here as copper(I) complexes. The bidentate ligand X∩X here represents β-diketonates, and hexafluoroacetylacetonate (hfac) is mentioned explicitly. The ligand L is a stabilizing ligand, for example, an olefin, such as trimethylvinylsilane (tmvs). The reduction can be effected, for example, with diethylsilane.

U.S. Pat. No. 6,482,740 B2 describes an ALD method of the generic type in which a copper oxide layer is first obtained. Here, copper(I) and copper(II) compounds are used as a precursor. For example, $(PEt_3)Cu(hfac)$ is mentioned as a copper(I) compound. For producing the oxide layer, in each case an oxidation pulse with water, $H_2O_2$, $O_2$, $O_3$ or similar oxidizing agents is carried out during an ALD cycle. For reducing the copper oxide layer, reducing agents such as ammonia, hydroxylamine, hydrazine, alcohols (e.g., methanol), aldehydes (e.g., butyraldehyde), carboxylic acids (e.g., formic acid or acetic acid) and hydrogen are used. The reduction is effected at temperatures of from 310 to 450° C.

The above methods have the disadvantage that fluorine-containing precursors are used. Fluorine can accumulate at the interface with the substrate material and reduce the adhesion of the copper layer to the substrate there.

WO 2004/036624 A2 discloses an ALD method in which a precursor which is not fluorine-containing is used. Homoleptic copper complexes, for example, copper(II) β-diketonates and copper(I) tert-butoxide, are proposed as the precursor here. Ozone, oxygen, water or mixtures thereof are used for the oxidation pulse; the reduction is effected by means of a hydrogen-containing gas.

SUMMARY OF THE INVENTION

In one aspect, the present invention overcomes disadvantages of the prior art and provides an improved ALD method for producing a copper layer.

A method can be used for the production of a coated substrate. The coating contains copper. A copper precursor and a substrate are provided. The copper precursor is a copper(I) complex which contains no fluorine. A copper-containing layer is deposited by means of atomic layer deposition (ALD) at least on partial regions of the substrate surface by using the precursor. Optionally, a reduction step is performed in which a reducing agent acts on the substrate obtained in the layer deposition step. In various embodiments, the precursor is a complex of the formula $L_2Cu(X∩X)$ in which L are identical or different σ-donor-π acceptor ligands and/or identical or different σ,π-donor-π acceptor ligands and X∩X is a bidentate ligand which is selected from the group consisting of β-diketonates, β-ketoiminates, β-diiminates, amidinates, carboxylates and thiocarboxylates.

BRIEF DESCRIPTION OF THE DRAWINGS

For a more complete understanding of the present invention, and the advantages thereof, reference is now made to the following descriptions taken in conjunction with the accompanying drawing, in which.

DETAILED DESCRIPTION OF ILLUSTRATIVE EMBODIMENTS

Figure 1:
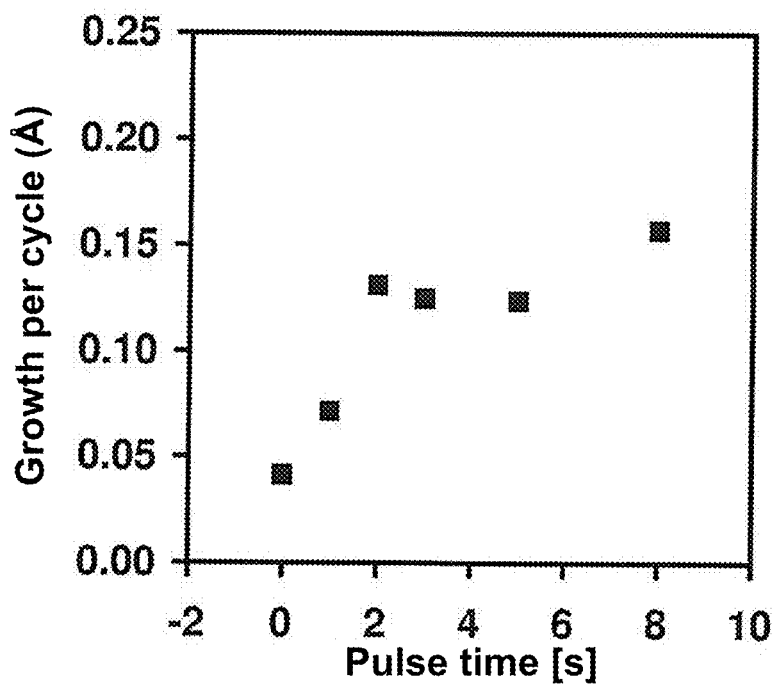
FIG. 1 shows the growth per cycle (GPC) as a function of the precursor pulse duration.

The present invention provides a method by means of which a substrate can be coated with a copper layer or a copper-containing layer. The layer deposition is effected by means of atomic layer deposition (ALD). A copper(I) complex that contains no fluorine is used as a precursor. The method according to the invention can be carried out in two variants. Either a reduction step can be effected after the predetermined number of ALD cycles has been completed. Alternatively, the reduction of the deposited copper-containing layer can be effected by means of a reduction pulse during an ALD cycle. Finally, it is also possible to entirely dispense with the reduction step if a coating comprising elemental copper is not desired but a copper oxide layer or a layer of another copper salt.

In the method according to the invention, a complex of the formula $L_2Cu(X\cap X)$ in which the two ligands L may be identical or different and which are σ-donor-π acceptor ligands and/or σ,π-donor-π acceptor ligands serves as a precursor. The ligand $X\cap X$ is a bidentate ligand which is selected from the group consisting of β-diketonates, β-ketoiminates, β-diiminates, amidinates, carboxylates and thiocarboxylates. In principle, these bidentate ligands are therefore a compound which has a single negative charge in the uncoordinated state and has two heteroatoms which are linked to one another via one or three carbon atoms.

As a rule, the bidentate ligand is coordinated at room temperature via two heteroatoms to the Cu in the precursor according to the invention. However, it is also possible for at least a part of the precursor to be coordinated only via one of the heteroatoms of the bidentate ligand. A complex in which one heteroatom of the bidentate ligand (at room temperature) is coordinated to two copper atoms is not one of the precursors suitable according to the invention. However, it is possible in a specific case for the two heteroatoms each to coordinate to different Cu atoms so that a binuclear complex forms. As a rule, however, the complexes according to the invention will be mononuclear complexes.

According to the invention, it was recognized that, by using 18 valence electron complexes instead of 16 valence electron complexes, precursors having a substantially higher stability are used but that these precursors can be decomposed to copper or converted by oxidation into a copper salt, such as, for example, copper oxide, under milder conditions than are usual according to the prior art. According to the invention, it was recognized that the complexes according to the invention are better suitable for the ALD since they have less tendency to independent decomposition (for example, through disproportionation), which would have greater CVD effects. This is associated with the fact that the precursors to be used can also be stored for a certain time without decomposition phenomena occurring and the method can therefore be carried out more economically. According to the invention, it was also recognized that, with the use of such precursors at the start of the decomposition reaction, a sufficiently high nucleus density occurs and hence the formation of growth islands occurs very rarely.

Preferably, the following (ALD) partial steps are effected in succession during the layer deposition step, wherein an oxidation pulse and/or a reduction pulse is always effected:
  adsorption pulse followed by a purge pulse or evacuation pulse
  optionally oxidation pulse followed by a purge pulse or evacuation pulse
  optionally reduction pulse followed by a purge pulse or evacuation pulse.

The single completion of said partial steps represents an ALD cycle. The reduction pulse and the subsequent purge or evacuation pulse are required only when the reduction is to be carried out in each case during an ALD cycle and when the reduction takes place not only after the predetermined number of ALD cycles has been completed and the reduction is dispensed with entirely. If a reduction pulse is effected during the ALD cycles, it is frequently (in particular in the case of layer formation on metal substrates) not necessary to carry out an oxidation pulse beforehand.

During the adsorption pulse (also referred to as precursor pulse), the precursor is fed to the reaction chamber in which the ALD method is carried out, so that a chemisorption and optionally also a physisorption of the precursor on the substrate surface take place on the substrate arranged in the reaction chamber. For this purpose, the precursor is fed to the reaction chamber in vapor form (in particular by vaporization or sublimation of the liquid or solid precursor) or in the form of a precursor/solvent mixture which was converted into the vapor phase. Usually, a carrier gas, in particular an inert gas, such as, for example, argon, is used for this feed.

The adsorption pulse is followed by a purge pulse or an evacuation pulse. This has the function of removing excess precursor so that ideally only a monolayer of the chemisorbed precursor remains on the substrate surface.

If intended, an oxidizing agent is fed to the reaction chamber in the subsequent step. This oxidizing agent reacts with the chemisorbed precursor molecules so that as a rule copper or a copper oxide (or another copper compound formed by the oxidation—depending on the oxidizing agent used) forms.

This is followed once again by a purge or evacuation pulse in order to remove reaction products from the reaction chamber. Very generally, an inert gas (for example, argon) is as a rule used for the purge pulses.

If intended, this can be followed by a reduction pulse in which a reducing agent is fed to the reaction chamber. As a rule, at least partial, preferably complete, reduction of the copper salt (in particular copper oxide) obtained in the oxidation pulse to elemental copper takes place here. In order to remove the reaction products obtained during the reduction pulse from the reaction space too, a purge or evacuation pulse once again follows.

Replication of this ALD cycle several times results in growth of the desired layer on the substrate.

Typically, an ALD process consists of more than 100 ALD cycles in order to produce layers having a thickness of several nanometers.

The ALD method is preferably carried out in a temperature range in which the growth per cycle varies only very little or not at all with the temperature. This has the advantage that a conformal layer which is uniform everywhere and has high thickness homogeneity is obtained on the regions of the substrate which are to be coated (also in obscured spaces). In contrast to CVD processes, it is possible, in particular in this temperature window, owing to the slower and more controlled layer growth, to obtain layers which have a lower minimum thickness and moreover in many cases form closed layers even at layer thicknesses which are less than 5 nm.

With the method according to the invention, a closed layer is maintained even after the reduction step has been carried out. In contrast, as a rule island formation due to agglomeration processes can be observed in the prior art.

In an advantageous configuration of the method according to the invention, a precursor complex which can be vaporized at moderate temperatures (up to 100° C.) (which is therefore liquid at these temperatures or can be sublimed) is used. The conversion to the vapor phase can be effected, for example, by means of applying reduced pressure. The level of the vapor pressure of the precursor used is not important here; all that is relevant is that the precursor molecules can undergo chemisorption on the substrate surface to be coated. Precursor complexes which are already liquid under standard temperature and pressure conditions (i.e., at room temperature and atmospheric pressure) are particularly preferred. These have the advantage that they can be vaporized more easily and in a more controlled manner than solids.

However, the use of solid precursors may also be advantageous. Solids can, for example, be dissolved and can thus also be used in "liquid" form. Such solid or dissolved precursors can be vaporized or sublimed at a high rate with a corresponding metering or evaporator system even at very low vapor pressures.

Under standard conditions, liquid complexes are obtained in particular when the ligand L of the complex $L_2Cu(X \cap X)$ is a trialkylphosphane. Trimethylphosphane, triethylphosphane, tri-n-propylphosphane and tri-n-butylphosphane may be mentioned in particular here.

The vapor pressure of the liquid or solid precursor should preferably be at least 0.005 mbar, particularly preferably 0.01 mbar, at the respective vaporization temperature, in order for the adsorption of a monolayer of precursor molecules on the substrate surface to take place in an industrially acceptable time so that the precursor pulse can be kept as short as possible. The vaporization temperature is preferably chosen here so that the complex just avoids decomposition as long as it is not yet present in the reaction chamber.

Very generally, any σ-donor-π acceptor or σ,π-donor-π acceptor can act as ligand L. The following may be mentioned in particular as ligands: isonitriles, alkynes and olefins (including dienes as bidentate ligands in which $L_2$ is exactly one diene ligand or an ene-yne ligand in which both unsaturated groups are coordinated to the central atom), in particular olefin and/or alkyne complexes in which the olefin or the alkyne acts as a σ,π-donor-π acceptor, and finally phosphane ligands. In the case of the phosphane ligands having the formula $PR^6_3$, the radicals $R^6$ may be identical or different, complexes in which the radicals $R^6$ are identical usually being used. $R^6$ may also be, in particular, an alkoxy radical $OR^7$. The radicals $R^6$ and $R^7$ may be in particular alkyl or aryl radicals. Suitable alkyl radicals are branched, straight-chain or cyclic alkyls, in particular having 1 to 15 carbon atoms; the alkyl radicals methyl, ethyl, n-propyl, isopropyl, n-butyl or tert-butyl and cyclohexyl are particularly preferred. Suitable aryl radicals are all substituted and unsubstituted aryl compounds; these may also be linked via an alkylene linker to the phosphorus or oxygen atom.

A particularly preferred aryl radical is phenyl. All above alkyl and aryl radicals may also be substituted by heteroatoms or may carry functional groups having heteroatoms (for example a bidentate ligand in which a coordinating $NR_2$ group is present). However, for cost reasons, pure hydrocarbon radicals are as a rule used. Suitable bidentate phosphane ligands are in particular ligands in which the two phosphorus atoms are linked via an ethylene or methylene linker. The remaining radicals bonded to the phosphorus atom correspond to the definition of the radicals $R^6$ and $R^7$. Bis(diphenylphosphino)ethane, bis(diphenylphosphino)methane and bis(diethylphosphino)ethane may be mentioned as particularly suitable bidentate phosphane ligands.

Inter alia, a β-diketonate, a β-ketoiminate or a β-diiminate can be used as the bidentate ligand $X \cap X$. Said ligand is therefore a ligand of the general formula $R—C(X)—CR^8—C(Y)—R^1$ or

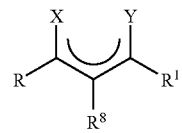

Here, X and Y are identical or different and are O or $NR^2$.

Preferably, the radicals R, $R^1$, $R^2$ and $R^8$ here are identical or different and are branched, straight-chain or cyclic alkyl radicals, aryl radicals or trialkylsilyl radicals. $R^8$ may also be a hydrogen atom. Preferably, these radicals have 1 to 15 carbon atoms. The alkyl and aryl radicals may be substituted by heteroatoms but are, as a rule pure, hydrocarbons; likewise, the radicals may carry functional groups. Particularly preferably, R, $R^1$ and $R^2$ are methyl, ethyl, n-propyl, isopropyl, n-butyl, tert-butyl or phenyl and $R^8$ is hydrogen, methyl, ethyl, n-propyl, isopropyl, n-butyl, tert-butyl or phenyl. In the case of the trialkylsilyl radicals, the individual alkyl radicals may be identical or different; branched, straight-chain or cyclic alkyls are suitable; trialkylsilyl radicals having the alkyl radicals methyl, ethyl, n-propyl, isopropyl, n-butyl and tert-butyl are particularly preferred.

Particularly preferred β-diketonate ligands are acetylacetone ("acac"), heptane-3,5-dione, 2,6-dimethylhepta-3,5-dione, 2,2,6,6-tetramethylhepta-3,5-dione, N,N,N',N'-tetramethylmalonamide, N,N,N',N'-tetraethylmalonamide, 1,3-dimorpholin-4-ylpropane-1,3-dione, 1,3-diphenylpropane-1,3-dione and 1,3-dicyclohexylpropane-1,3-dione.

4-(Methylamino)-3-penten-2-one and 4-(ethylamino)-3-penten-2-one are particularly preferred as β-diketoiminate ligands.

(2Z,4E)-N-isopropyl-4-(methylimino)pent-2-en-2-amine and N-[(1E,2Z)-1-methyl-2-pyrrolidin-2-ylideneethylidene]methanamine are particularly preferred as β-diiminate ligands.

Alternatively, the bidentate ligand $X \cap X$ present in the precursor complex may be an amidinate, a carboxylate or a thiocarboxylate. In the general formula $R^3—C(X')—Y'$ or

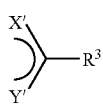

X' and Y' are therefore either two oxygen atoms or an oxygen atom and a sulfur atom or two NR$^4$ groups.

The radicals R$^3$ and R$^4$ are identical or different and are preferably branched, straight-chain or cyclic alkyl radicals or aryl radicals. Preferably, these radicals have 1 to 15 carbon atoms. The radicals may be substituted by heteroatoms but as a rule are pure hydrocarbons; likewise, the radicals may carry functional groups. Particularly preferably, the radicals R$^3$ and R$^4$ are methyl, ethyl, n-propyl, isopropyl, n-butyl, tert-butyl or phenyl. The radical R$^3$ may furthermore be a trialkylsilyl radical in which the individual alkyl radicals may be identical or different. Branched, straight-chain or cyclic alkyls are suitable here; the alkyl radicals methyl, ethyl, n-propyl, isopropyl or n-butyl and tert-butyl are particularly preferred.

In an advantageous configuration, the amidinate, the carboxylate and the thiocarboxylate have a carboxylate group in the alkyl or aryl radical. In particular, carboxylates of the formula R$^5$O—C(O)—Z—C(O)—O or

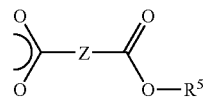

may be mentioned here.

Here, Z is an alkylene or alkylidene bridge or a single bond between the two carbonyl groups C(O). Preferably, the alkylene group has the formula —(CH$_2$—)$_n$ (where n=0, 1 or 2); the alkylidene bridge preferably has the formula —(CH=CH—)$_m$ (where m=0, 1 or 2).

The radical R$^5$ is preferably a branched, straight-chain or cyclic alkyl radical or an aryl radical, in particular a methyl, ethyl, n-propyl, isopropyl, n-butyl, tert-butyl or phenyl radical.

According to the invention, acetate, benzoate, benzylate, propionate, pivalonate, 2-methylpropionate, silyl-substituted acetates, thioacetate and N,N'-dimethylacetamidines are particularly preferred as the amidinate, carboxylate or thiocarboxylate ligand.

According to the invention, it has been found that some precursor complexes are particularly preferred. These are complexes which are easily obtainable synthetically and moreover are liquid at room temperature and can be easily converted into the gas phase and furthermore can be stored for a certain time. The following complexes may be mentioned here:

the acetylacetonate complexes (acac complexes) of the formula (R$^7_3$P)$_2$Cu(acac) where R$^7$=methyl, ethyl, n-propyl, isopropyl, n-butyl and tert-butyl the heptane-3,5-dionate complexes of the formula (R$^7_3$P)$_2$Cu(C$_2$H$_5$—C(O)—CH—C(O)—C$_2$H$_5$) where R$^7$=methyl, ethyl, n-propyl, isopropyl, n-butyl and tert-butyl the acetate complexes of the formula (R$^7_3$P)$_2$Cu(O$_2$CCH$_3$) where R$^7$=methyl, ethyl, n-propyl, isopropyl, n-butyl and tert-butyl.

Usually, a liquid or gaseous oxidizing agent is used for the oxidation pulse of the ALD method according to the invention. The oxidizing agent is preferably gaseous and furthermore the oxidizing agent is preferably selected from the group consisting of oxygen, water, H$_2$O$_2$, ozone and N$_2$O.

These oxidizing agents are preferred since an oxidation pulse can be carried out under relatively mild conditions with them (in particular even at temperatures in the range from 105° C. to 135° C.).

The use of wet oxygen (i.e., a mixture of steam and oxygen) is particularly preferred since wet oxygen is a more effective oxidizing agent than oxygen or steam alone, and the ALD therefore functions better at low temperatures at which the precursor itself does not yet decompose. This is as a rule accompanied by a lower tendency of the copper-containing layer produced to undergo agglomeration.

The reducing agent for the reduction step or the reduction pulse is preferably selected from the group consisting of hydrogen plasma, molecular hydrogen (H$_2$), carbon monoxide, hydrazine, boranes, silanes and organic reducing agents.

In particular, alcohols, aldehydes and carboxylic acids may be mentioned here as organic reducing agents. These are usually low molecular weight compounds having a molecular weight of <100 g/mol, preferably <61 g/mol. Peculiar to compounds having such a low molecular weight is in fact that their oxidation products are relatively readily volatile and can therefore be relatively easily removed from the reaction chamber (or can be withdrawn from an equilibrium reaction). Very generally, all organic reducing agents have the advantage that they permit a reduction under mild conditions so that here too agglomeration and island formation do not occur during the reduction process or do so only to a rather small extent. If, on the other hand, hydrogen or a hydrogen plasma is used, no significant reduction occurs at temperatures of <200° C. (i.e., no reduction of the proportion of oxygen in the copper-containing layer—particularly with the use of hydrogen). Moreover, the ALD should preferably be carried out without the use of a plasma, in order to achieve a uniform layer growth in all regions, even in deep and geometrically complicatedly structured substrates. The use of a plasma can then also lead to a strong tendency to undergo agglomeration.

Methanol, isopropanol, formaldehyde, acetaldehyde, formic acid and acetic acid may be mentioned as particularly suitable organic reducing agents, among which again formic acid is very particularly preferred.

Peculiar to these compounds is that a reduction can take place under particularly mild conditions, in particular a reduction at temperatures of 200° C.; in the case of formic acid, even at temperatures of from 105 to 115° C.

The ALD method according to the invention is preferably carried out in such a way that the individual pulses (adsorption pulse, oxidation pulse, reduction pulse and purge or evacuation pulse) take as a rule each not more than 15 seconds. However, the pulse duration is also dependent on the volume of the respective reactor. Preferably, the length of the pulses is from 3 to 11 seconds. In the case of very compact reactor chambers, the required pulse length may also be in the range from 10 to a few 100 milliseconds.

For the adsorption pulse, it is furthermore true that the pulse duration is particularly preferably from 3 to 6 seconds. Furthermore, the pulse duration of the adsorption pulse is preferably exactly so long that at least a deposition rate or a growth per cycle of 0.08 Å/cycle and particularly preferably of 0.12 Å/cycle is achieved. This is as a rule the case when the pulse duration of the adsorption pulse is at least 2 seconds.

The adsorption pulse is preferably effected at a temperature of from 105 to 165° C., particularly preferably at a temperature of from 115 to 135° C.

In this temperature window, the growth per cycle shows relatively little dependence on the temperature, and a more targeted production of a copper layer or copper-containing layer having a certain layer thickness is therefore possible. The growth per cycle is usually particularly constant at a temperature of from 115 to 135° C.

Furthermore, the method according to the invention is preferably carried out in such a way that the reduction step or the reduction pulse is carried out at a temperature of <250° C., preferably <200° C. However, the temperature to be chosen also depends here on the reducing agent, so that—even if it were to be desirable to work at lower temperatures—a free selectivity of the reduction temperature exists only within certain limits. For example, a significant reduction will occur with the use of hydrogen ($H_2$) only from temperatures of 400 to 450° C. Relatively high temperatures are therefore required for the reduction of the copper oxide with molecular hydrogen ($H_2$). Owing to the increased tendency of the copper to undergo agglomeration at these temperatures, it is however then no longer possible to obtain thin and closed surface layers. A lower process temperature is possible through the use of hydrogen plasma. However, this has the disadvantage that the plasma affects structured substrates differently. Free surfaces are preferentially attacked whereas it is difficult to achieve complete reduction of the copper oxide or copper salt on side walls of deep trenches, in holes and in obscured regions.

The temperature should therefore be as low as possible if little agglomeration or island formation is to take place during the reduction step or reduction pulse. Carrying out the reduction step or reduction pulse at a temperature which corresponds to that of the adsorption pulse or is below this temperature is therefore preferred. This can be realized, for example, by means of organic reducing agents; the use of formic acid, which gives good results at a temperature as low as 105° C., is very particularly preferred here.

Furthermore, plasma processes should—if possible—be dispensed with in order to ensure uniform reduction of the layer applied by means of ALD, even in structured substrates or obscured regions of structured substrates. Purely thermal reduction processes are therefore preferred.

A one-layer or multilayer substrate can be used as the substrate to be coated. Here, at least one layer of the multilayer substrate (preferably that layer of the multilayer substrate which is adjacent to the copper layer or copper-containing layer) or the one-layer substrate itself is particularly preferably a transition metal, a transition metal salt (in particular a ceramic compound, such as a transition metal nitride or transition metal oxide), a semiconductor material, an organic polymer and/or an inorganic polymer or contains one or more substances of the abovementioned classes of substances.

Furthermore, this material is preferably selected from the group consisting of tantalum, titanium, tungsten, niobium, vanadium, tantalum nitride, titanium nitride, tungsten nitride, niobium nitride and vanadium nitride, platinum, palladium, ruthenium, rhodium, a silicon dioxide, a silicate, zinc oxide, hafnium oxide, aluminum oxide, zirconium oxide, silicon, germanium, gallium arsenide, aluminum gallium arsenide, gallium nitride, aluminum gallium nitride, indium phosphide, indium gallium phosphide and carbonitrides or silicon nitrides of transition metals, in particular of tantalum, tungsten and titanium; alternatively, this material may contain one or more of the abovementioned substances.

Surprisingly, it was observed that a lower tendency to form islands than with the use of the pure transition metal as a substrate occurs on substrates comprising a transition metal nitride during the reduction step. This effect is observable to a particularly pronounced extent with the use of tantalum nitride (in particular in comparison with elemental tantalum).

Furthermore, it was observed that the nitrogen content of the transition metal nitride is of considerable importance for the growth of the copper-based ALD layer. More rapid decomposition of the copper precursor takes place on the pure transition metal, so that more nonuniform layer growth occurs. However, this also means that the decomposition of the precursor only begins at higher temperatures on a transition metal nitride, so that the use of nonstoichiometric transition metal nitrides, in particular nitrides of tantalum, titanium, tungsten, niobium and/or vanadium, is particularly preferred if a particularly uniform copper layer is to be produced. Once again, a proportion of nitrogen of from 75 to 99%, based on the corresponding stoichiometric transition metal nitride compound $MN_x$, is present here. Once again, this effect is observable to a particularly pronounced extent in the case of tantalum/tantalum nitride.

According to the invention, the substrate which can be produced by the method described above has, at least in part, a closed surface copper coating or copper-containing coating, as a rule a completely closed surface copper coating or copper-containing coating. According to the invention, a closed surface layer is understood as meaning a layer in which signals of the substrate are no longer detected on measurement by means of X-ray photoelectron spectroscopy (XPS—Mg—Kα radiation is used). The depth of emergence of the photoelectrons should be from 1 nm to 3 nm for this purpose in the case of a quasi-perpendicular take-off angle. The method of measurement is always carried out according to "S. Hofmann: Depth Profiling in AES and XPS in: Practical Surface Analysis Second Edition Volume 1—Auger and X-ray Photoelectron Spectroscopy. (Editors D. Briggs and M. P. Seah) John Wiley & Sons, Chichester et al., 1990".

The copper coating has no fluorine-containing impurities (since no fluorine-containing precursor molecules were used) and has a layer thickness of from 2 nm to 100 nm, preferably from 2 nm to 30 nm. According to the invention, the layer thickness is always measured by means of spectral ellipsometry in the spectral range from 3.3 to 6.3 eV. The measurement is carried out according to H. G. Tompkins and E. A. Irene (Editors): Handbook of Ellipsometry. Springer-Verlag, Berlin 2005. For microelectronic and nanoelectronic components, integrated circuits, preferably copper nucleation layers having thicknesses of from 2 to 20 nm, are used for producing the conductor track system.

Furthermore, the substrate according to the invention having a copper coating preferably has a roughness Ra according to DIN EN ISO 4287 of from 0.2 nm to 2.7 nm, with a roughness Ra of the uncoated substrate of from 0.1 nm to 0.2 nm. Ra was determined by means of atomic force microscopy (AFM) in the tapping mode. A silicon tip having a tip radius of ≦10 nm was used. The difference between the roughness Ra of the coated and the uncoated substrate is therefore generally from 0 to 2.5 nm, preferably from 0 to 0.2 nm. However, this difference is dependent firstly on the thickness of the coating and secondly on the surface of the substrate used.

Furthermore, the substrate according to the invention having a copper coating frequently has trenches, holes and/or obscured spaces. Such substrates cannot be coated at all by many methods according to the prior art (e.g., CVD methods), at least not with a uniform layer. The method according to the invention has the advantage that a uniform copper coating or copper-containing coating can be applied even to such substrates.

With the method according to the invention, a substrate which has, at least in part, a cohesive copper- and copper oxide-containing coating is furthermore obtainable—once again in a corresponding procedure. This substrate is obtainable, for example, when a reduction step or reduction pulses is or are completely dispensed with. This coating then has no fluorine-containing impurities and has a layer thickness of from 2 nm to 100 nm, preferably from 2 nm to 30 nm. The layer substantially comprises $Cu_2O$ in the region of the surface and has a gradient with decreasing oxygen content between this surface and that face of the coating which faces the substrate.

This gradient can be detected by angle-resolved XPS investigations (ARXPS) according to S. Oswald et al. Angle-resolved XPS—a critical evaluation for various applications, Surface and Interface Analysis 38, 2006, 590-594. It is found here that, at a take-off angle of 25° to the sample surface, as a rule only bond energy values which are coordinated with oxidic copper (in particular $Cu_2O$) are measured. On the other hand, in the case of measurements at a take-off angle of 60°, a substantial proportion of the measured bond energies of the photoelectrons is coordinated with elemental copper. At a take-off angle of 75°, the proportion of these photoelectrons is even further increased. Regarding the roughness, the statements made above with regard to a substrate in which a reduction step or reduction pulse is not dispensed with are also applicable to the substrate having a copper- and copper oxide-containing coating.

The method according to the invention can be used for the production of copper layers, in particular copper starting layers for subsequent electrochemical or currentless deposition of metal layers, in particular copper layers, in the production of contact and conductor track systems in microelectronic components and in the production of thin-film solar cells.

For the production of a multilayer conductor track or interconnect system in highly integrated microelectronic circuits (ULSI circuits), copper layers in the range of from 10 to 100 nm are applied electrochemically to prestructured silicon wafers provided with various functional layers. Before the electrochemical copper deposition can take place, it is necessary to apply an electrically conductive nucleating or starting layer (a so-called seed layer) to this wafer. The method according to the invention is most suitable for producing such seed layers since a layer having uniform thickness forms, the thickness—as described—being arbitrarily adjustable and therefore always leading to success even in the case of geometrically complicated arrangements of through-hole vias between adjacent conductor track levels and the like.

If, in the field of so-called 3D or vertical system integration, a plurality of wafers or microchips are connected to one another permanently and mechanically by means of bond methods, so-called through-hole vias (THVs or through-silicon vias—TSVs) are used for producing electrical contacts between the individual chips. These are very deep, narrow holes (in particular having a diameter from 5 µm to 150 µm and aspect ratios of from 1 to 20) through the chip or wafer stack. In order to produce the electrical contact between the components to be connected, these holes are completely or partly filled by means of electrochemical copper deposition. For this purpose too, an electrically conductive seed layer is required. The method according to the invention is also most suitable for producing these seed layers since—even in the case of complicated geometries—copper layers having uniform thickness can be produced.

The abovementioned seed layers must meet high requirements. They must form a closed surface and grow without defects on the substrate present in each case, which generally comprises substrate materials or diffusion barrier layers of transition metals, such as tantalum or tungsten, or transition metal nitrides, such as tantalum nitride or tungsten nitride. Here, the seed layers must grow uniformly in all regions of the substrates to be coated. Layer thickness differences between the bottoms of trenches or holes, their side walls and free surfaces on the wafer substrate are undesired since otherwise nonuniform layer growth owing to nonuniform current density distribution would occur during the subsequent electrochemical copper deposition. At the same time, the seed layers should have very good electrical conductivity and as little roughness as possible. Finally, they must also adhere very well to the substrate so that the layer stack has high mechanical stability for subsequent polishing processes. Reduced adhesion of the copper layers moreover results in reduced electrical reliability of the conductor track in the subsequent component, in particular with regard to electromigration.

The method according to the invention and the copper layer which can be produced therewith are described in more detail below without limitation of the universality.

1. Production of a Copper- and/or Copper Oxide-Containing Layer on a Silicon Wafer 1.1 Method with an Oxidation Pulse During the Layer Deposition Step Carried Out by Means of ALD with the Use of the Precursor $((CH_3CH_2CH_2CH_2)_3P)_2Cu(acac)$ For the ALD, a silicon wafer which is provided (a) with a tantalum nitride layer,
(b) with a tantalum layer or (c) with a combination of a tantalum nitride and a tantalum layer
(namely a layer system in which a tantalum layer is present at the top and a tantalum nitride layer underneath) or (d) with a silicon dioxide layer or (e) with a ruthenium layer is introduced into a reaction chamber (vacuum chamber) and heated to a temperature of from 100° C. to 150° C. The precursor used is $((CH_3CH_2CH_2CH_2)_3P)_2Cu(acac)$. The precursor is fed to the reaction chamber with the aid of a liquid metering system comprising an evaporator unit. The precursor is stored under inert gas (in particular argon) at room temperature in a storage container. For metering, the liquid precursor is transported with the aid of the superatmospheric inert gas pressure in the storage vessel out of said vessel and via a flow meter to a mixing unit in which the precursor is metered with the aid of a nozzle and mixed with an inert carrier gas stream (in particular argon carrier gas stream). This mixture is fed to the evaporator unit, where the precursor is vaporized at from 85° C. to 100° C. The carrier gas/precursor vapor mixture thus obtained is now fed to the reaction chamber. Expediently, this is effected via heated pipes. The duration of the precursor pulse carried out in this manner is 5 seconds; the precursor vapor is fed to the process chamber at a rate of 15 mg/min and an argon carrier gas flow rate of 700 sccm (standard cubic centimeters per minute). A purge pulse of 5 seconds follows, in which argon is fed to the reaction chamber at a rate of 145 sccm. For the oxidation pulse, a mixture of oxygen and water vapor is used as the oxidizing agent. For producing the water vapor, argon is passed through water which was heated to 45° C. to 50° C. and in this way is laden with water vapor. The oxidation pulse as well as the adsorption pulse are carried out at 120-135° C. and a pressure from 0.6 to 1.2 mbar and have a duration of 11 seconds. For this purpose, oxygen at a flow rate of 90 sccm and 18.5 mg/min of water vapor with an argon carrier gas flow rate of 210 sccm (the latter preferably via heated pipes) is fed to the reaction chamber to the reaction chamber. This is once again followed by a purge pulse as described above.

400 ALD cycles—as described above—are carried out, and thus a layer of about 5 to 6 nm thickness is obtained. The layer is very smooth on all substrates and is distinguished by very good adhesion to the substrate.

FIG. 1 shows the growth per cycle (GPC) as a function of the precursor pulse duration if tantalum nitride is chosen as the substrate and 135° C. as the deposition temperature.

Figure 2:
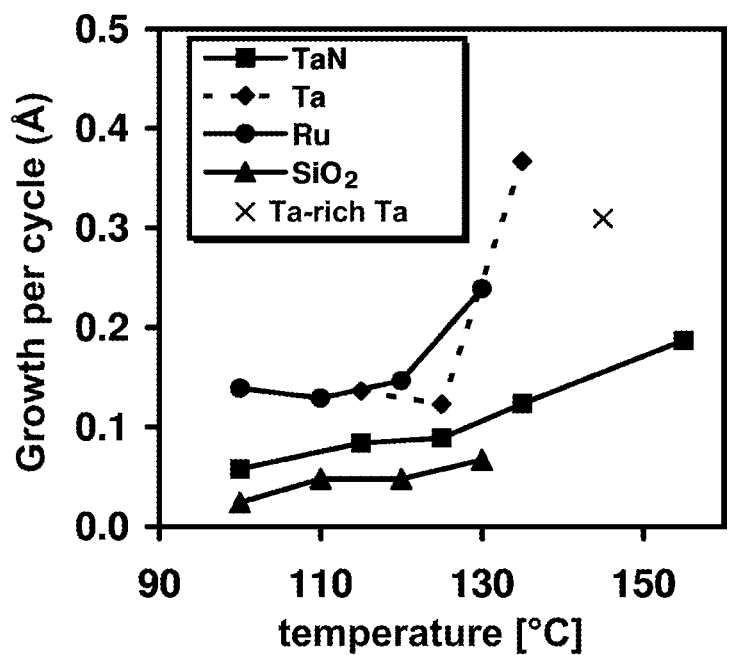
FIG. 2 shows the growth per cycle (GPC) as a function of the deposition temperature.

FIG. 2 shows the growth per cycle (GPC) as a function of the deposition temperature, inter alia for the substrates (a) to (e). It is evident from FIG. 2 that the "temperature window" typical of ALD and in which the deposition rate (i.e., the growth per cycle GPC in Å) does not vary or varies only very slightly with the temperature is approximately from 100 to 125° C. A particularly small variation in the deposition rate results for $SiO_2$ substrates from 110 to 120° C. and for TaN substrates from 115 to 125° C. and for ruthenium substrates from 100 to 120° C.

Figure 3:
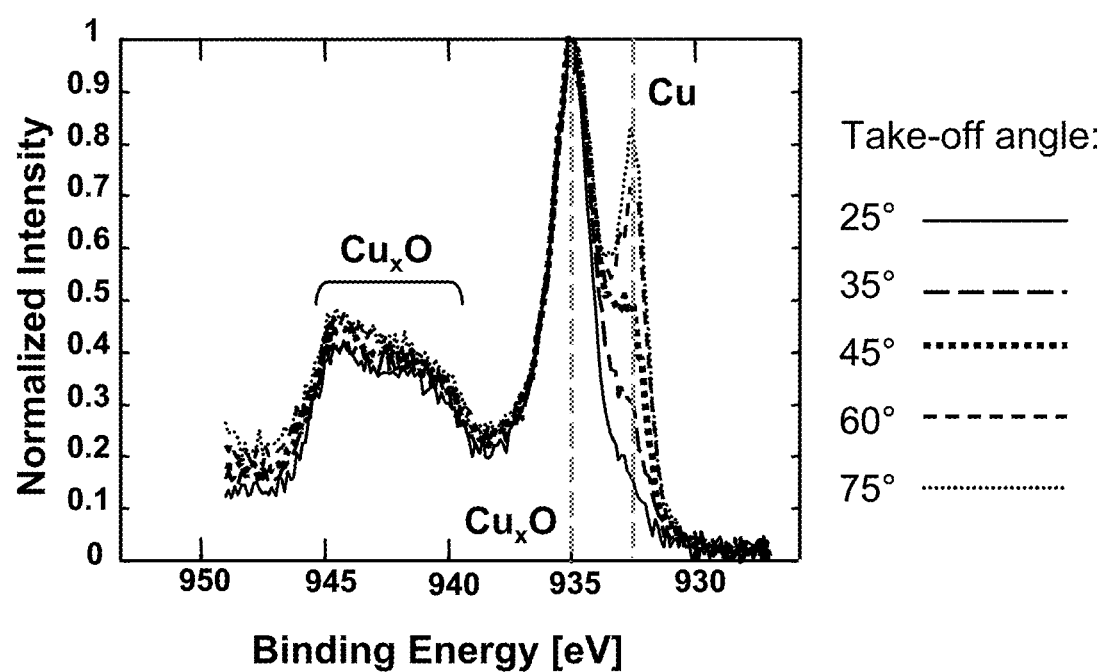
FIG. 3 shows a copper/copper oxide gradient in a layer.

FIG. 3 shows the copper/copper oxide gradient in the layer obtained. The angle-resolved XPS spectrum (ARXPS spectrum) shows the Cu2p3 signal of a 5 nm thick layer on tantalum nitride. The signals are recorded at angles of 25°, 35°, 45°, 60° and 75°, measured in each case relative to the sample surface.

Figure 4:
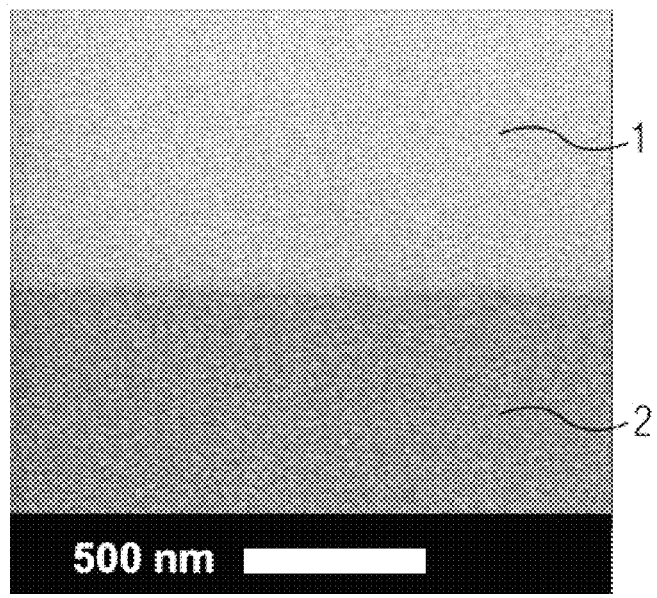
FIG. 4 shows a surface scanning electron micrograph (SEM)

FIG. 4 shows a surface scanning electron micrograph (SEM) of the resulting layer (2) on tantalum nitride (1) (the oxidation pulse occurred at 135° C.). The ALD layer (2) was partially removed in order to make the tantalum nitride surface (1) underneath visible. A smooth, cohesive ALD layer is detectable. A layer thickness of 4.9 nm was determined ellipsometrically.

Figure 5:
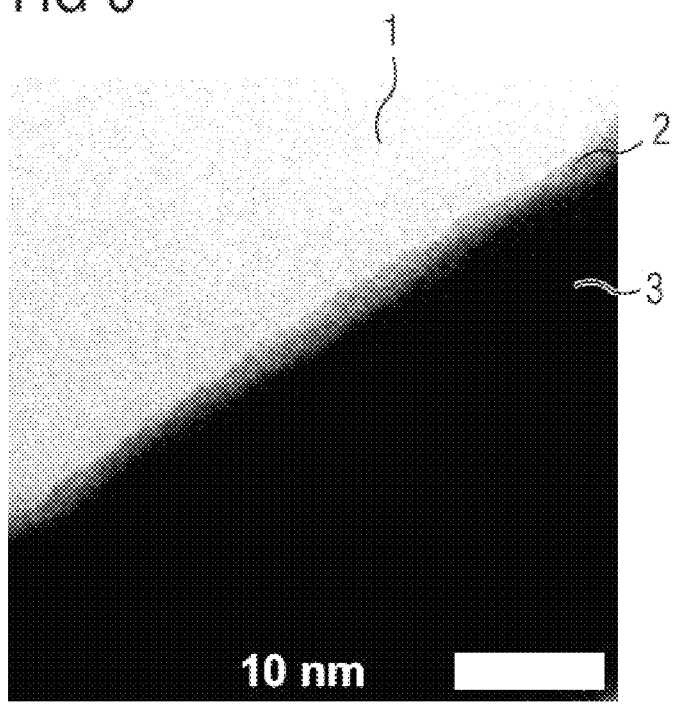
FIG. 5 shows a cross-sectional transmission electron micrograph (TEM)

FIG. 5 shows a cross-sectional transmission electron micrograph (TEM) of the resulting ALD layer (2) on tantalum nitride (3) which was obtained according to example 1.1 (the oxidation pulse occurred at 125° C.). In order to protect the surface of the ALD layer (2), a plastic layer (1) was applied thereon.

Figure 6:
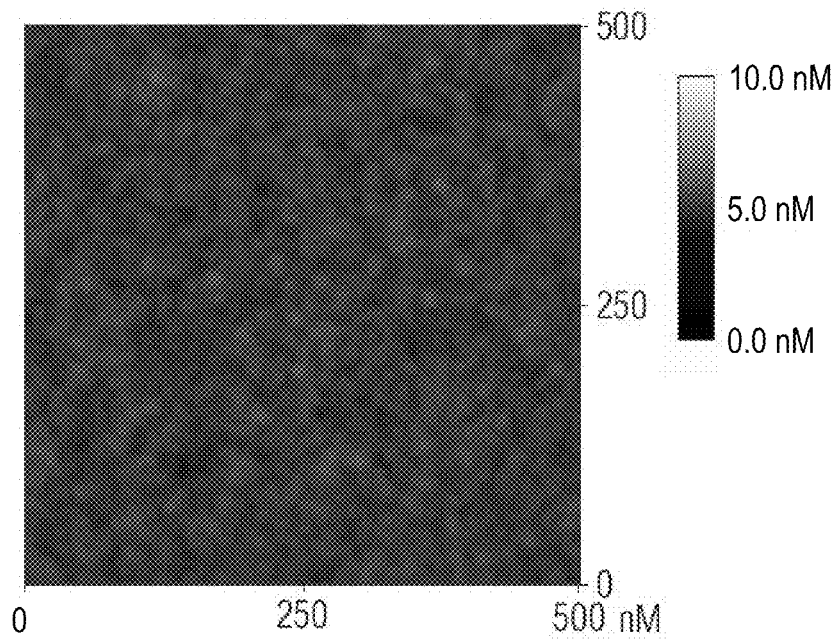
FIG. 6 and FIG. 7 show surface atomic force micrographs.
Figure 7:
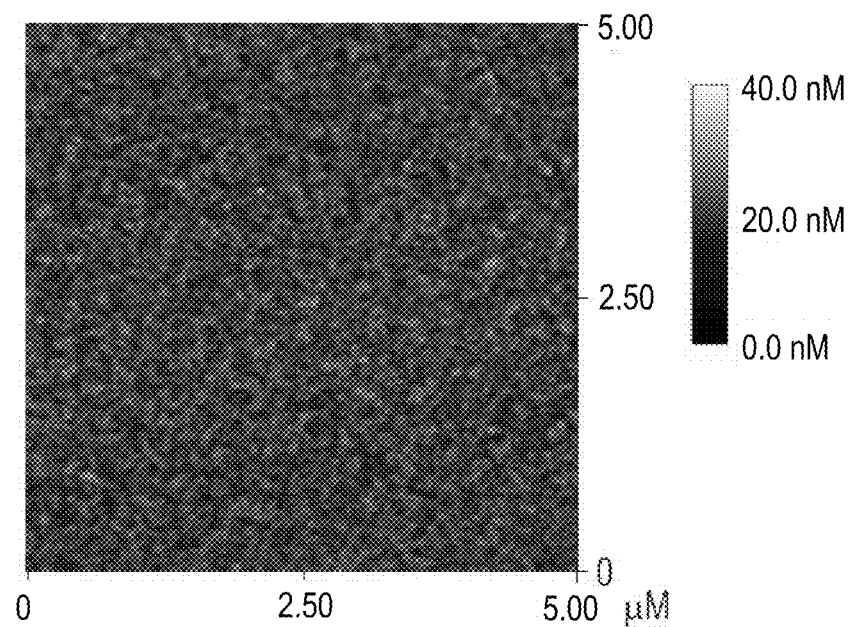

FIG. 6 and FIG. 7 show surface atomic force micrographs of the resulting ALD layer.

FIG. 6 shows the ALD layer on silicon dioxide (d) as a substrate (the oxidation pulse occurred at 120° C.). The layer thickness is 2.8 nm; a value of 0.2 nm was determined for the roughness Ra. An uncoated $SiO_2$ comparative substrate likewise showed a roughness Ra of 0.2 nm. FIG. 7 shows the ALD layer on tantalum nitride (a) as a substrate (the oxidation pulse occurred at 125° C.). The layer thickness is 3.6 nm; a value of 1.9 nm was determined for the roughness Ra. An uncoated tantalum nitride comparative substrate showed a roughness Ra of 0.2 nm.

1.2 Method with an Oxidation Pulse During the Layer Deposition Step Carried Out by Means of ALD with the Use of the Precursor $((CH_3CH_2)_3P)_3Cu(O_2CCH_3)$ Layers comparable to those in example 1.1 are obtained if $((CH_3CH_2)_3P)_3Cu(O_2CCH_3)$ is used as precursor for the ALD process. The precursor is vaporized as in example 1.1 with a liquid metering system at from 100° C. to 125° C. and a flow rate of from 5 to 10 mg/min and mixed with argon as carrier gas at a flow rate of 1000 sccm. The ALD process which, in the same way as in example 1.1, is composed of adsorption pulse, first purge pulse, oxidation pulse and second purge pulse was carried out at temperatures of from 150° C. to 200° C. on a silicon wafer coated with TiN.

1.3. Method with a Reduction Pulse During the Layer Deposition Step Carried Out by Means of ALD with the Use of the Precursor $((CH_3CH_2CH_2CH_2)_3P)_2Cu(acac)$ As in example 1.1, a coated silicon wafer is used for the ALD method. In contrast, the coating is a ruthenium coating which is about 100 nm thick and is applied by means of a Ti adhesion-promoting layer of about 10 nm to the silicon wafer. The application of the Ti adhesion-promoting layer and of the ruthenium coating can be effected, for example, by means of electron beam vapor deposition.

As in example 1.1, a silicon wafer coated in this manner is introduced into a reaction chamber and heated. The precursor used is $((CH_3CH_2CH_2CH_2)_3P)_2Cu(acac)$. The precursor is fed to the reaction chamber with the aid of a liquid metering system with evaporator unit and stored under inert gas (in particular argon) at room temperature in a storage container. For metering, the liquid precursor is transported with the aid of the superatmospheric inert gas pressure in the storage vessel out of said vessel and via a flow meter to a mixing unit, in which the precursor is metered with the aid of a nozzle and mixed with an inert carrier gas stream (in particular argon carrier gas stream). This mixture is fed to the evaporator unit, where the precursor is vaporized at from 85° C. to 100° C. The carrier gas/precursor vapor mixture thus obtained is now fed to the reaction chamber. Expediently, this is effected via heated pipes. The duration of the precursor pulse is 5 seconds; the precursor vapor is fed to the process chamber at a rate of 15 mg/min and an argon carrier gas flow rate of 700 sccm. A purge pulse of 5 seconds follows, in which argon is fed to the reaction chamber at a rate of 145 sccm. In contrast to examples 1.1 and 1.2, a reduction pulse now follows. The reducing agent used is formic acid vapor. In order to produce it, a carrier gas (in particular argon) is passed through formic acid heated to 45° C.-50° C. and in this way is laden with the formic acid vapor. The carrier gas/formic acid vapor mixture thus obtained is fed via heated pipes to the reaction chamber. The duration of the reduction pulse is 11 seconds; the formic acid vapor is fed to the process chamber at a rate of 50 µl/min and an argon carrier gas flow rate of 210 sccm. Once again, a purge pulse as described above follows. As in examples 1.1 and 1.2, the precursor pulse, the purge pulse and the reduction pulse are carried out at a pressure of from 0.6 to 1.2 mbar.

If 400 ALD cycles are carried out as described above, a layer of about 4 nm thickness is obtained on the ruthenium substrate.

Figure 8:
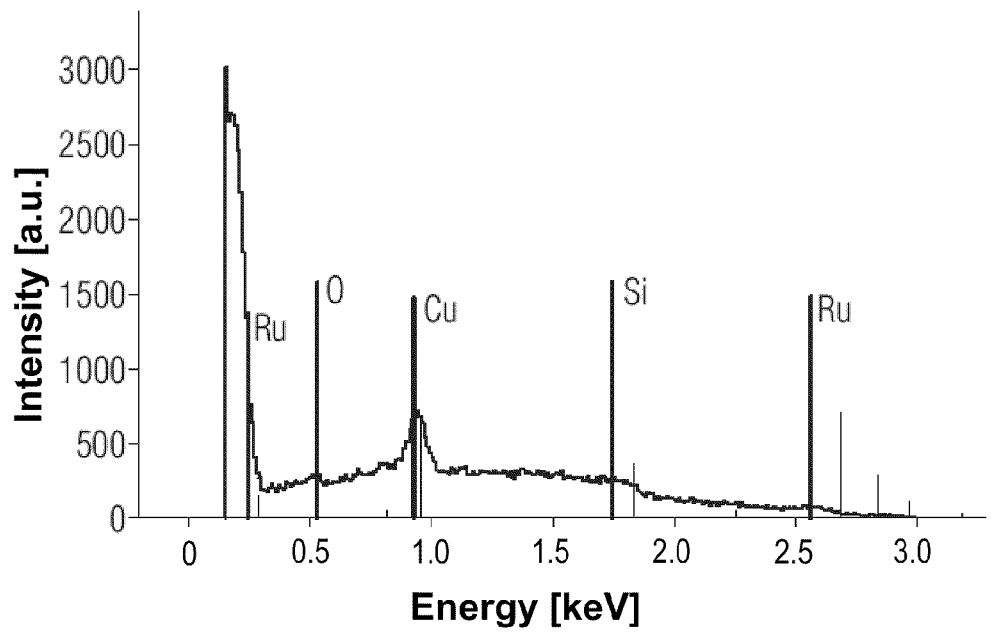
FIG. 8 shows an X-ray spectrum gained by means of energy-dispersive X-ray analysis (EDX)

FIG. 8 shows the X-ray spectrum gained by means of energy-dispersive X-ray analysis (EDX) at a primary electron beam energy of 3 keV for the layer obtained according to example 1.3. In addition to signals which are to be assigned to the substrate (ruthenium and silicon), the spectrum shows a very substantial copper signal. Since only a very weak oxygen signal is present, the layer obtained according to example 1.3 substantially comprises metallic copper. The oxygen signal is presumably due to a subsequent oxidation of the copper layer already produced, which oxidation could take place as a result of air contact of the produced layer before the measurement. Silicon substrate and Ti adhesion-promoting layer are only poorly detectable or not detectable owing to the layer stack present on the top.

2. Reduction of the Copper/Copper Oxide-containing Layer

For the reduction of the abovementioned copper/copper oxide layer, the substrate carrying this layer is treated in a reaction chamber as follows:

The substrate obtained according to example 1.1 or 1.2 and carrying the layer to be reduced is heated to a temperature of from 100 to 300° C. in a vacuum chamber. In the presence of a reducing gas or a liquid reducing agent to be vaporized, the reduction process is carried out at a pressure of from 0.1 to 13 mbar, usually from 0.7 to 7 mbar. The duration of the process is from 1 min to 60 min, usually from 10 min to 30 min. If a gaseous reducing agent is employed, it can be used in pure form or as a mixture with an inert gas, e.g., argon. If liquid reducing agents are used, they are as a rule vaporized by means of a liquid metering system or bubbler and then passed together with an inert gas as a carrier gas (e.g., argon) into the reaction chamber.

For the purpose of treating copper/copper oxide-containing layers on tantalum or tantalum nitride substrates according to example 1.1, formic acid at a temperature of 65° C. was vaporized in a liquid metering system at a flow rate of 80 mg/min and fed together with argon carrier gas at a flow rate of 100 sccm to the reaction chamber via pipes likewise heated to 65° C. The layers were subjected to the reducing treatment at a pressure of 1.3 mbar and at temperatures of from 100° C. to 300° C., preferably at from 100 to 150° C., for from 20 min to 40 min.

Figure 9:
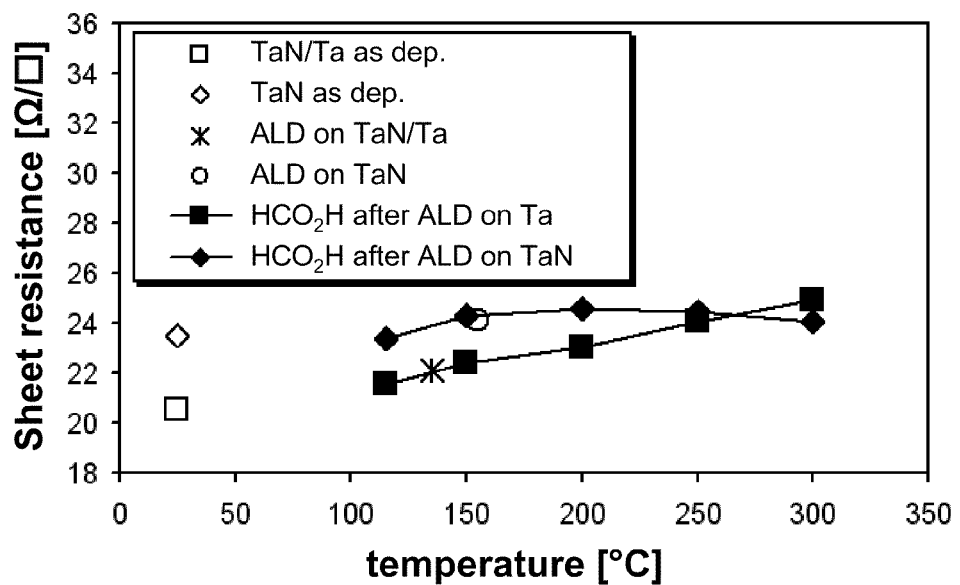
FIG. 9 shows layer resistances of pure tantalum nitride or of the combination of a tantalum nitride layer and a tantalum layer.

FIG. 9 shows the layer resistances of pure tantalum nitride or of the combination of a tantalum nitride layer and a tantalum layer (designated as "as dep."), of the corresponding substrates provided with a 5 nm thick copper oxide layer (designated as "ALD on . . . ") and of the layers treated as above with formic acid as the reducing agent. It is found that, at particularly low reduction temperatures, the layer resistance decreases compared with the unreduced system, which is an indication that, apart from the reduction, no island formation or only slight island formation takes place.

Figure 10:
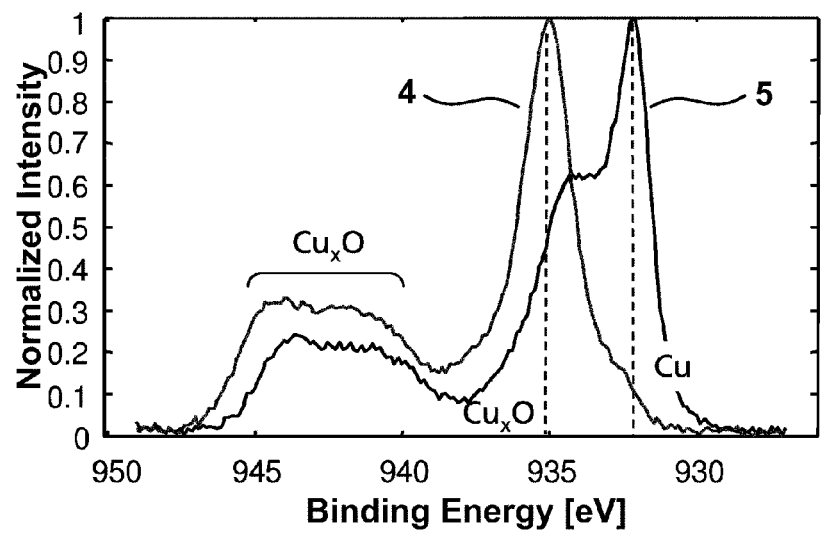
FIG. 10 shows the change in the copper or copper oxide proportion after and before a reducing treatment.

FIG. 10 shows the change in the copper or copper oxide proportion after and before the reducing treatment according to example 2, measured by means of X-ray photoelectron spectroscopy (XPS). Spectrum "4" was recorded before the reducing treatment; the coated substrate obtained according to example 1.1 or 1.2 was additionally stored here for 25 weeks in air, with the result that the copper- and copper oxide-containing layer has been completely converted into a copper oxide layer. The bond energies detected in the spectrum are to be assigned exclusively to oxidic copper. Spectrum "5" shows the bond energies after a 20 minute reducing treatment with formic acid vapor according to example 2 at a temperature of 115° C. The layer formed has high proportions of metallic copper (the copper oxide signals are for the most part to be attributed to the fact that the sample was stored in air before recording the spectrum for about 7 weeks). The spectra shown in FIG. 10 result from XPS measurements at a take-off angle of 45°.

Figure 11:
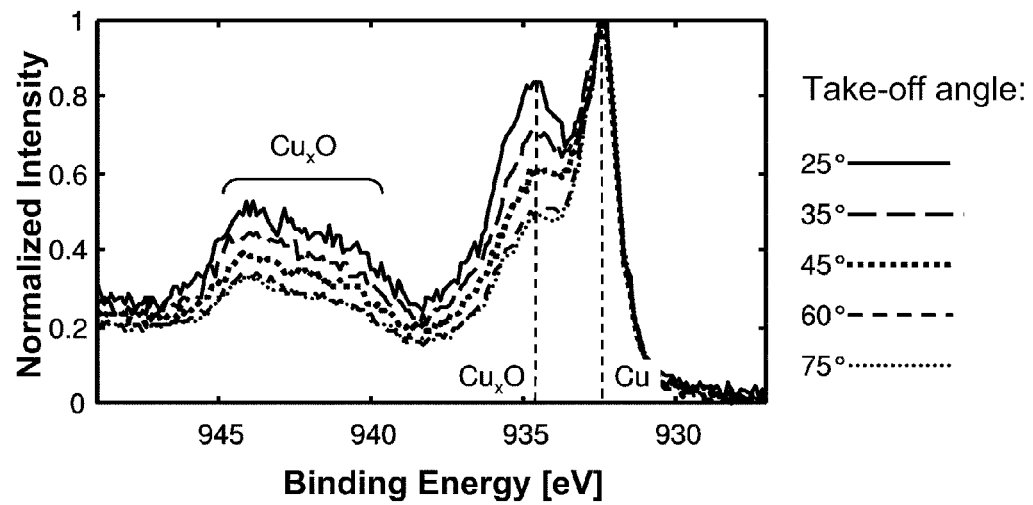
FIG. 11 shows the ARXPS spectrum of the sample shown in FIG. 10.

FIG. 11 shows the ARXPS spectrum of the sample shown in FIG. 10. The signals were recorded at angles of 25°, 35°, 45°, 60° and 75°, measured in each case relative to the sample surface. It is evident therefrom that the oxidized portion of copper is present substantially in layers of the sample which are close to the surface, which indicates subsequent oxidation owing to air contact of the sample after the reducing treatment is complete. At larger take-off angles, the regions located further away from the sample surface are also analyzed; only low signals for copper oxide are to be found there.

Figure 12:
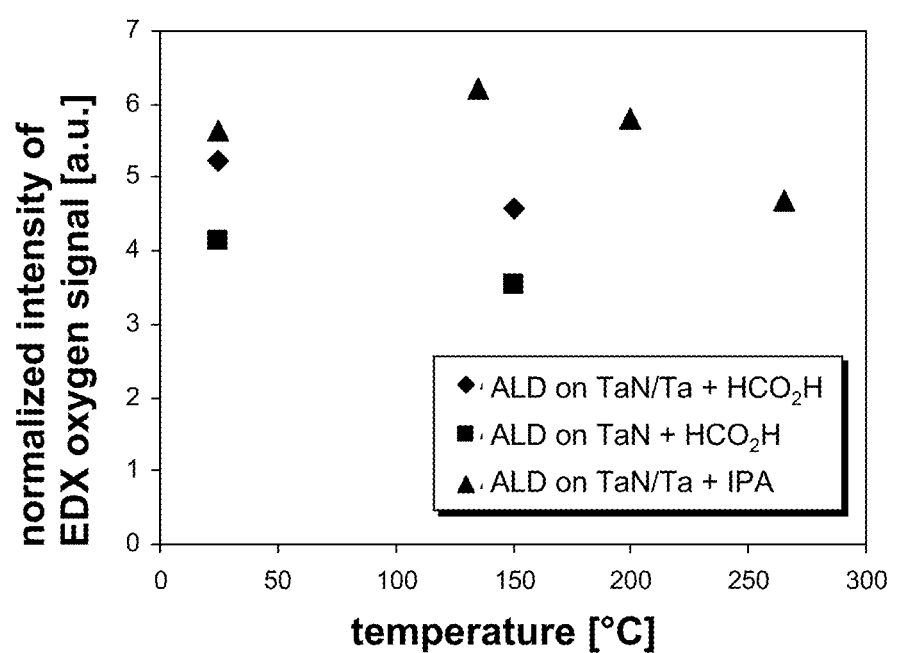
FIG. 12 shows an EDX oxygen signal (normalized) obtained by means of energy-dispersive X-ray analysis (EDX).

FIG. 12 shows the EDX oxygen signal (normalized) obtained by means of energy-dispersive X-ray analysis (EDX) after carrying out reduction processes with various reducing agents on tantalum nitride or on the combination of a tantalum nitride layer and a tantalum layer. FIG. 12 shows that, on carrying out the reduction at 155° C., a significant reaction is observable only with formic acid. With the use of isopropanol (IPA), a significant reducing effect occurs only at from 155 to 200° C.

3. Investigation of the Adhesive Strength of the Layers Produced by Means of ALD The layers obtained according to examples 1.1, 1.2, 1.3 and 2 on substrates comprising tantalum, tantalum nitride, ruthenium and silicon dioxide were investigated with respect to their strength of adhesion to the substrate used in each case. For this purpose, the adhesive tape peeling test ("Tapetest") according to J. Baumann, "Herstellung, Charakterisierung und Bewertung von leitfähigen Diffusionsbarrieren auf Basis von Ta, Ti und W für die Kupfermetallisierung von Siliziumschaltkreisen [Production, characterization and evaluation of conductive diffusion barriers based on Ta, Ti and W for the copper metalization of silicon circuits]", Shaker Verlag, Aachen, 2004, page 216, was carried out. The Tesa® 4129 adhesive tape with an adhesive force of 8 N/25 mm was used according to DIN EN 1939. As a result of this investigation, flaking or delamination of the ALD layers from the respective substrate was not found in any of the samples tested.

What is claimed is:

1. A method for producing a coated substrate, the method comprising:
   providing a copper precursor and a substrate, the copper precursor being a copper(I) complex that contains no fluorine;
   depositing a copper-containing layer using atomic layer deposition (ALD) at least on partial regions of a surface of the substrate by using the precursor, wherein the precursor is a complex of the formula $L_2Cu(X \cap X)$ where
   L are identical or different σ-donor-π-acceptor ligands and/or identical or different σ,π-donor-π-acceptor ligands, and
   $X \cap X$ is a bidentate ligand selected from the group consisting of β-diketonates, β-ketoiminates, β-diiminates, amidinates, carboxylates and thiocarboxylates; and
   obtaining a copper-containing layer free of defects and having uniform thickness.

2. The method as claimed in claim 1, further comprising performing a reduction in which a reducing agent acts on the substrate obtained after depositing the copper-containing layer.

3. The method as claimed in claim 1, wherein depositing the copper-containing layer comprises:
   (a) performing an adsorption pulse, in which the substrate is exposed to the precursor;
   (b) performing a purge pulse or evacuation pulse; and
   (c) performing an oxidation pulse, followed by a purge pulse or evacuation pulse, and/or reduction pulse, followed by a purge pulse or evacuation pulse, wherein the substrate is treated with an oxidizing agent during the oxidation pulse and the substrate is treated with a reducing agent during the reduction pulse; and
   wherein (a), (b) and (c) are repeated a plurality of times in the stated sequence.

4. The method as claimed in claim 1, wherein the precursor is liquid at room temperature.

5. The method as claimed in claim 1, wherein the precursor is a complex in which the bidentate ligand $X \cap X$ has the formula $R-C(X)-CR^8-C(Y)-R^1$, wherein:
   X and Y are identical or different and are O or $NR^2$,
   R, $R^1$ and $R^2$ are identical or different and are a branched, straight-chain or cyclic alkyl radical, an aryl radical or a trialkylsilyl radical, and
   $R^8$ is hydrogen, a branched, straight-chain or cyclic alkyl radical, an aryl radical or a trialkylsilyl radical.

6. The method as claimed in claim 1, wherein the precursor is a complex in which the bidentate ligand $X \cap X$ has the formula $R_3-C(X')-Y'$, where
   X' is O, S or $NR^4$,
   Y' is O or $NR^4$, and
   $R^3$ and $R^4$ are identical or different and are a branched, straight-chain or cyclic alkyl radical or an aryl radical.

7. The method as claimed in claim 6, wherein $R^3$ and $R^4$ are identical or different and are a branched, straight-chain or cyclic alkyl radical or an aryl radical and contain a carboxylate group.

8. The method as claimed in claim 6, wherein the bidentate ligand X∩X has the formula $R^5O-C(O)-Z-C(O)-O$, wherein Z is an alkylene or alkylidene bridge or a bond between the two carbonyl groups and has the formula $-(CH2-)_n$ (where n=0, 1 or 2) or the formula $(-CH=CH-)_m$ (where m=0, 1 or 2), and $R^5$ is a branched, straight-chain or cyclic alkyl radical or an aryl radical.

9. The method as claimed in claim 3, wherein the oxidizing agent is liquid or gaseous and is selected from the group consisting of oxygen, water, $H_2O_2$, ozone and $N_2O$.

10. The method as claimed in claim 2, wherein the reducing agent is selected from the group consisting of alcohols, aldehydes and carboxylic acids.

11. The method as claimed in claim 10, wherein the reducing agent is selected from the group consisting of isopropanol, formaldehyde and formic acid.

12. The method as claimed in claim 3, wherein the adsorption pulse lasts for not more than 11 seconds.

13. The method as claimed in claim 3, wherein the adsorption pulse is carried out at a temperature of from 105° C. to 165° C.

14. The method as claimed in claim 2, wherein the reduction is carried out at a temperature of less than 250° C.

15. The method as claimed in claim 1, wherein the substrate comprises one layer or a plurality of layers and wherein at least one of the layers comprises a layer selected from the group consisting of a transition metal, a transition metal salt, a semiconductor material, an organic polymer and an inorganic polymer.

16. The method as claimed in claim 15, wherein the substrate comprises a material selected from the group consisting of Ta, Ti, W, Nb, V, nitrides, carbonitrides or silicon nitrides of Ta, Ti, W, Nb, V, Pt, Pd, Ru, Rh, $SiO_2$, silicates, ZnO, $HfO_2$, $Al_2O_3$, $ZrO_2$, Si, Ge, GaAs, AlGaAs, GaN, AlGaN, InP and InGaP.

17. The method as claimed in claim 16, wherein the substrate to be coated with the copper-containing layer comprises a nonstoichiometric nitride of Ta, Ti, W, Nb and/or V with a nitrogen ratio of 75-99%, based on the corresponding stoichiometric compound.

18. The method as claimed in claim 1, wherein L is selected from isonitril, alkyne and olefin ligands.

19. The method as claimed in claim 1, wherein L is a phosphane ligand.

20. The method as claimed in claim 1, wherein the substrate to be coated is a substrate for a microelectronic component or a thin-film solar cell.

21. The method as claimed in claim 2, wherein the copper-containing layer is a seed layer for a subsequent deposition of metal layers.

22. A method for producing a coated substrate, the method comprising:

providing a copper precursor and a substrate, the copper precursor being a copper(I) complex that contains no fluorine;

depositing a copper-containing layer using atomic layer deposition (ALD) at least on partial regions of a surface of the substrate by using the precursor, wherein the precursor is a complex of the formula $L_2Cu(X∩X)$ where L are identical or different σ-donor-π-acceptor ligands and/or identical or different σ,π-donor-π-acceptor ligands, and X∩X is a bidentate ligand selected from the group consisting of β-ketoiminates, β-diiminates, amidinates, carboxylates and thiocarboxylates.

* * * * *